(12) United States Patent
Monavarian et al.

(10) Patent No.: US 11,652,188 B2
(45) Date of Patent: May 16, 2023

(54) METHOD OF FABRICATING BROAD-BAND LATTICE-MATCHED OMNIDIRECTIONAL DISTRIBUTED BRAGG REFLECTORS USING RANDOM NANOPOROUS STRUCTURES

(71) Applicant: UNM Rainforest Innovations, Albuquerque, NM (US)

(72) Inventors: Morteza Monavarian, Albuquerque, NM (US); Daniel Feezell, Albuquerque, NM (US); Behnam Abaie, Albuquerque, NM (US); Arash Mafi, Albuquerque, NM (US); Saadat Mishkat-Ul-Masabih, Albuquerque, NM (US)

(*) Notice: Subject to any disclaimer, the term of this patent is extended or adjusted under 35 U.S.C. 154(b) by 232 days.

(21) Appl. No.: 17/083,242

(22) Filed: Oct. 28, 2020

(65) Prior Publication Data
US 2021/0126161 A1    Apr. 29, 2021

Related U.S. Application Data

(60) Provisional application No. 62/926,602, filed on Oct. 28, 2019.

(51) Int. Cl.
*H01L 33/10* (2010.01)
*H01S 5/183* (2006.01)
(Continued)

(52) U.S. Cl.
CPC .......... *H01L 33/10* (2013.01); *H01L 33/0075* (2013.01); *H01L 33/32* (2013.01);
(Continued)

(58) Field of Classification Search
CPC ............... H01S 5/3054; H01S 5/18363; H01S 5/18361; H01S 5/34333; H01S 5/3086;
(Continued)

(56) References Cited

U.S. PATENT DOCUMENTS

| 11,043,792 B2* | 6/2021 | Han | H01L 21/30635 |
| 11,258,231 B2* | 2/2022 | Zhao | H01S 5/3054 |
| 2017/0237234 A1* | 8/2017 | Han | H01S 5/187 |
| | | | 372/45.012 |

FOREIGN PATENT DOCUMENTS

WO    WO 2021/013642 A    *    1/2021    ............. H01L 33/10

OTHER PUBLICATIONS

Yeh, Pochi and Yariv, Amnon. "Bragg Reflection Waveguides," Optics Communications, vol. 19, Iss. 3, Dec. 1976, pp. 427-430.
(Continued)

*Primary Examiner* — Savitri Mulpuri
(74) *Attorney, Agent, or Firm* — MH2 Technology Law Group LLP

(57) ABSTRACT

A method of forming and a random Distributed Bragg Reflector (DBR) is disclosed. The random DBR includes a substrate and a plurality of alternating layers of lattice-matched nanoporous GaN (NP-GaN) and GaN formed on a top surface of the substrate, wherein at least one of the alternating layers has a thickness of $\lambda/4n$ and an adjacent one of the alternating layers does not have a thickness of $\lambda/4n$, wherein $\lambda$ is a wavelength of incident radiation and n is the refractive index of a particular layer of the plurality of alternating layers.

20 Claims, 11 Drawing Sheets

(51) Int. Cl.
  *H01L 33/32* (2010.01)
  *H01L 33/00* (2010.01)
  *H01L 33/46* (2010.01)
  *H01S 5/042* (2006.01)

(52) U.S. Cl.
  CPC .......... *H01L 33/46* (2013.01); *H01S 5/04253* (2019.08); *H01S 5/18361* (2013.01)

(58) Field of Classification Search
  CPC ............. H01S 5/04253; H01S 5/04257; H01S 2301/173; H01S 5/18341; H01S 5/2009; H01S 5/18369; H01L 33/10; H01L 33/0075; H01L 33/32; H01L 33/46
  See application file for complete search history.

(56) References Cited

OTHER PUBLICATIONS

Chang-Hasnain, Connie J. "Tunable VCSEL," IEEE J. Selected Topics in Quantum Electronics, vol. 6, No. 6, Nov./Dec. 2000, pp. 978-987.
Wiersma, Diederik S. et al. "Localization of Light in a Disordered Medium," Nature, vol. 390, Dec. 1997, pp. 671-673.
Gessman, T. et al. "Omnidirectional Reflective Contacts for Light-Emitting Diodes," IEEE Electron Device Letters, vol. 24, No. 10, Oct. 2003, pp. 683-685.
Mafi, Arash. "Anderson Localization in a Partially Random Bragg Grating and a Conserved Area Theorem," Optics Letters, vol. 40, No. 15 (2015), pp. 3603-3606.
Chen, Danti et al. "Nanopores in GaN by Electrochemical Anodization in Hydrofluoric Acid: Formation and Mechanism," J. Appl. Phys. 112, 064303 (2012), 6 pages [retrieved on Oct. 28, 2020], retrieved from the internet: <URL: https://doi.org/10.1063/1.4752259>.
Mafi, Arash. "Transverse Anderson Localization of Light: a Tutorial," Advances in Optics and Photonics, vol. 7, Iss. 3 (2015), pp. 459-515 [retrieved on Oct. 28, 2020], retrieved from the internet: <URL: https://doi.org/10.1364/AOP.7.000459>.
Katsidis, Charalambos C. and Siapkas, Dimitrios I. "General Transfer-Matrix Method for Optical Multilayer Systems with Coherent, Partially Coherent, and Incoherent Interference," Applied Optics, vol. 41, No. 19, Jul. 2002, pp. 3978-3987.
Berry, M. V. and Klein, S. "Transparent Mirrors: Rays, Waves and Localization," European Journal of Physics, 18 (1997), pp. 222-228 [retrieved on Oct. 28, 2020], retrieved from: EPS European Journal of Physics Database.
Lagendijk, Ad et al. "Fifty Years of Anderson Localization," Phys. Today 62(8), 24 (2009) [retrieved on Oct. 28, 2020], retrieved from the internet: URL<https:www.physicstoday.org/resource/1/PHTOAD/v62/i8>.
Anderson, P. W. "Absence of Diffusion in Certain Random Lattices," Physical Review, vol. 109, No. 5 (1958), pp. 1492-1505.
Tawara, Takehiko et al. "Low-Threshold Lasing of InGaN Vertical-Cavity Surface-Emitting Lasers with Dielectric Distributed Bragg Reflectors," Appl. Phys. Lett. 83, 830 (2003), pp. 830-832 [retrieved on Oct. 28, 2020], retrieved from the internet: <URL: https://doi.org/10.1063/1.1596728>.
Carlin, J.-F. and Ilegems, M. "High-Quality AlInN for High Index Contrast Bragg Mirrors Lattice Matched to GaN," Appl. Phys. Lett. 83, 668 (2003), pp. 668-670 [retrieved on Oct. 28, 2020], retrieved from the internet: <URL: https://doi.org/10.1063/1.1596733>.
Ng, H. M. et al. "High Reflectivity and Broad Bandwidth AlN/GaN Distributed Bragg Reflectors Grown By Molecular-Beam Epitaxy," Appl. Phys. Lett. 76, 2818 (2000), pp. 2818-2820 [retrieved on Oct. 28, 2020], retrieved from the internet: <URL: https://doi.org/10.1063/1.126483>.
Mishkat-UL-Masabih, Saadat et al. "Nanoporous Distributed Bragg Reflectors on Free-Standing Nonpolar M-Plane GaN," Appl. Phys. Lett. 112, 041109 (2018), pp. 41109-1-41109-5 [retrieved on Oct. 28, 2020], retrieved from the internet: <URL: https://doi.org/10.1063/1.5016083>.
Zhang, Cheng et al. "Mesoporous GaN for Photonic Engineering-Highly Reflective GaN Mirrors as an Example," ACS Photonics 2 (7), 2015, pp. 980-986 [retrieved on Oct. 29, 2020].
Pendry, J.B. "Symmetry and Transport of Waves in One-Dimensional Disordered Systems," Advances in Physics, vol. 43, Iss. 4 (1994), pp. 461-542.
Zhang, Cheng et al. "Distributed Bragg Reflectors for GaN-Based Vertical-Cavity Surface-Emitting Lasers," Appl. Sci. 2019, 9(8), 1593, 20 pages [retrieved on Oct. 28, 2020], retrieved from the internet: <URL: https://doi.org/10.3390/app9081593>.

* cited by examiner

Fully Random Stack

Ascending Sorted Stack

Descending Sorted Stack

Grouped Random Stack

METHOD OF FABRICATING BROAD-BAND LATTICE-MATCHED OMNIDIRECTIONAL DISTRIBUTED BRAGG REFLECTORS USING RANDOM NANOPOROUS STRUCTURES

CROSS-REFERENCE TO RELATED APPLICATIONS

This application claims priority to provisional U.S. Provisional Application No. 62/926,602 filed on Oct. 28, 2019, the disclosure of which is hereby incorporated by reference in its entirety.

GOVERNMENT RIGHTS

This disclosure was made with Government support under Contract No. 1454691 awarded by the National Science Foundation (NSF). The Government has certain rights in the invention.

FIELD

The present teachings generally relate methods of fabricating broad-band lattice-matched omnidirectional distributed Bragg reflectors using random nanoporous structures.

BACKGROUND

Distributed Bragg Reflectors (DBRs) are the key building blocks for various optoelectronic and photonics applications including lasers, light-emitting diodes (LEDs), optical waveguides, etc. DBRs are nothing but mirrors that reflect a significant portions of the incident light—an ability which is crucial in realizing wave oscillation as well as wave guiding in various optoelectronic and photonic devices. A periodic one-dimensional (1D) DBR includes of alternating layers with different refractive indices. Depending on the periodicity, number of pairs, and the refractive indices of the two alternating materials used ($n_1$ and $n_2$), a transmittance bandgap (stop-band) with different widths and reflectivity is achieved. The width of this stop-band Is strongly dependent on the refractive index contrast and is limited in the periodic systems. By applying a degree of disorder to a fully periodic DBR, Anderson localization of light in a disordered media can be observed.

SUMMARY

In accordance with examples of the present disclosure, a methods of fabricating disorder-induced broad-band omnidirectional distributed Bragg reflectors comprising a stack of alternating layers with randomized thicknesses with different degrees of randomness with two different refractive indices is disclosed.

Various additional features can be included in the method including the following features. The thicknesses of both materials are randomized. The thicknesses of only one material is randomized and the thickness of the other material is kept constant. Each pair includes of the same material throughout the stack. Each layer can be composed of a different material. The semiconductor material can comprise materials such as GaN, AlN, InAlN, AlGaN, or InGaN. The dielectric material can include material such as $SiN_x$, $SiO_2$, $HfO_2$, or $TiO_2$. The nanoporous semiconductor material can include materials such as nanoporous GaN, AlN, InAlN, AlGaN, or InGaN. The metal-organic chemical vapor deposition can be used to grow the stack of doped/unintentionally doped or lightly doped III-nitrides followed by electrochemical porosification. The DBRs are formed by electrochemical etching through sidewalls of mesa structures. The DBRs are formed by electrochemical etching through defect-selective etching on planar structures. The randomized thicknesses of the stacked layers are not sorted. The randomized thicknesses of the stacked layers are sorted descending. The randomized thicknesses of the stacked layers are sorted ascending. The thicknesses of the stacked layers are grouped into smaller periodic constituents. The grouped stacks with similar materials are used. The grouped stacks with different materials are used. The method can be used in broad-band air guiding waveguides. The method can be used as omnidirectional broadband back reflectors of LEDs to improve light-extraction efficiency. The method can be used as omnidirectional broadband back reflectors of solar-cells to improve light absorption. The method can be used for lateral or vertical optical confinement in laser diodes and super luminescent diodes. The method can be used as bottom and/or top reflectors in vertical-cavity surface emitting lasers. The method can be used as reflectors in lasers and in photonics applications such as photonic integrated circuits. The method can be implemented using various epitaxial/deposition methods such as metalorganic chemical vapor deposition, molecular-beam epitaxy, hydride vapor phase epitaxy, plasma-enhanced chemical vapor deposition, remote-plasma chemical vapor deposition, or sputtering. The method can be applied to all visible, ultraviolet, and infrared wavelengths. The method can be applied to other materials systems.

In accordance with examples of the present disclosure, a random Distributed Bragg Reflector (DBR) is disclosed. The random DBR comprises a substrate; and a plurality of alternating layers of lattice-matched nanoporous GaN (NP-GaN) and GaN formed on a top surface of the substrate, wherein at least one of the alternating layers has a thickness of $\lambda/4n$ and an adjacent one of the alternating layers does not have a thickness of $\lambda/4n$, wherein $\lambda$ is a wavelength of incident radiation and n is the refractive index of a particular layer of the plurality of alternating layers.

Various additional features can be included in the random DBR including one or more of the following. The NP-GaN is formed by electrochemical-based porosification of a highly Si-doped GaN layers grown by metal-organic chemical vapor deposition (MOCVD), molecular-beam epitaxy (MBE), atomic layer deposition (ALD), or any other deposition techniques in an electrolyte solution. The alternating layers of lattice-matched NP-GaN and GaN are formed by selectively-doped GaN using MOCVD followed by electrochemical process. The NP-GaN can be tuned to have a refractive index of around 1 to around 2.5 depending on a porosity of the NP-GaN. The NP-GaN can be unintentionally doped (UID) or lightly doped meaning where the doping does not create porosification in the layer. For example lightly doping can be less than $5 \times 10^{17}$ or less than $2 \times 10^{17}$. The random DBR has a reflectivity range for incident radiation with a wide range of radiation from UV to IR, including a portion of a range from about 200 nm to about 900 nm depending on the index of refraction of the nanoporous layers and thickness of the layers. For example, for a random DBR with 30 alternating layers and an index of refraction of about 1.59 for the NP-GaN, the reflectivity range for incident radiation can be from 600 nm to about 900 nm. The substrate comprises sapphire. The thickness of each NP-GaN layer is the same. The thickness of each GaN is not the same.

In accordance with examples of the present disclosure, a method of forming a random Distributed Bragg Reflector (DBR) is disclosed. The method comprises forming a plurality of alternating layers of lattice-matched nanoporous GaN (NP-GaN) and GaN formed on a top surface of the substrate, wherein at least one of the alternating layers has a thickness of $\lambda/4n$ and an adjacent one of the alternating layers does not have a thickness of $\lambda/4n$, wherein $\lambda$ is a wavelength of incident radiation and n is the refractive index of a particular layer of the plurality of alternating layers.

Various additional features can be included in the method of forming the random DBR including one or more of the following. The NP-GaN is formed by electrochemical-based porosification of a highly Si-doped GaN layers grown by metal-organic chemical vapor deposition (MOCVD) in an electrolyte solution. The alternating layers of lattice-matched NP-GaN and GaN are formed by selectively-doped GaN using MOCVD followed by electrochemical process. The NP-GaN can be tuned to have a refractive index of around 1 to around 2.5 depending on a porosity of the NP-GaN. The random DBR has a reflectivity range for incident radiation of about 200 nm to about 900 nm depending on the index of refraction of the nanoporous GaN, the layer thicknesses, and the number of layer periods. The substrate comprises sapphire. The thickness of each NP-GaN layer is the same. The thickness of each GaN is not the same.

In accordance with examples of the present disclosure, a waveguide is disclosed. The waveguide comprises a first random Distributed Bragg Reflector (DBR) comprising: a first random Distributed Bragg Reflector (DBR) comprising: a first substrate; and a first set of a plurality of alternating layers of lattice-matched nanoporous GaN (NP-GaN) and GaN formed on a top surface of the substrate, wherein at least one of the first set of alternating layers has a thickness of $\lambda/4n$ and an adjacent one of the first set of alternating layers does not have a thickness of $\lambda/4n$, wherein $\lambda$ is a wavelength of incident radiation and n is the refractive index of a particular layer of the plurality of alternating layers; a second random Distributed Bragg Reflector (DBR) comprising: a second substrate; and a second set of a plurality of alternating layers of lattice-matched nanoporous GaN (NP-GaN) and GaN formed on a top surface of the first random DBR, wherein at least one of the second set of alternating layers has a thickness of $\lambda/4n$ and an adjacent one of the second set of alternating layers does not have a thickness of $\lambda/4n$, In accordance with examples of the present disclosure, a light emitting diode (LED) device is disclosed. The LED device comprises a LED; and a back reflector configured to reflect light from the LED, wherein the back reflector comprises a random Distributed Bragg Reflector (DBR) comprising: a substrate; and a plurality of alternating layers of lattice-matched nanoporous GaN (NP-GaN) and GaN formed on a top surface of the substrate, wherein at least one of the alternating layers has a thickness of $\lambda/4n$ and an adjacent one of the alternating layers does not have a thickness of $\lambda/4n$, wherein $\lambda$ is a wavelength of incident radiation and n is the refractive index of a particular layer of the plurality of alternating layers.

In accordance with examples of the present disclosure, a solar cell device is disclosed. The solar cell devices comprises a solar cell; and a reflector configured to reflect light from the solar cell, wherein the reflector comprises a random Distributed Bragg Reflector (DBR) comprising: a substrate; and a plurality of alternating layers of lattice-matched nanoporous GaN (NP-GaN) and GaN formed on a top surface of the substrate, wherein at least one of the alternating layers has a thickness of $\lambda/4n$ and an adjacent one of the alternating layers does not have a thickness of $\lambda/4n$, wherein $\lambda$ is a wavelength of incident radiation and n is the refractive index of a particular layer of the plurality of alternating layers.

BRIEF DESCRIPTION OF THE FIGURES

FIG. 2A shows a fully random stack, FIG. 2B shows an ascending sorted random, FIG. 2C shows a descending sorted random, and FIG. 2D shows a grouped random stacks.

(FIG. 6A) periodic, (FIG. 6B) grouped random, (FIG. 6C) fully random, and (FIG. 6D) sorted random.

(FIG. 8A) broad-band air guiding waveguides and (FIG. 8B) high LEE LEDs with a broadband omnidirectional back-reflector.

(FIG. 9C) descending sorted random dielectric (SiN$_x$/SiO$_2$) DBR stacks on Si. Insets schematically show each DBR stack.

DETAILED DESCRIPTION

Figure 1B:
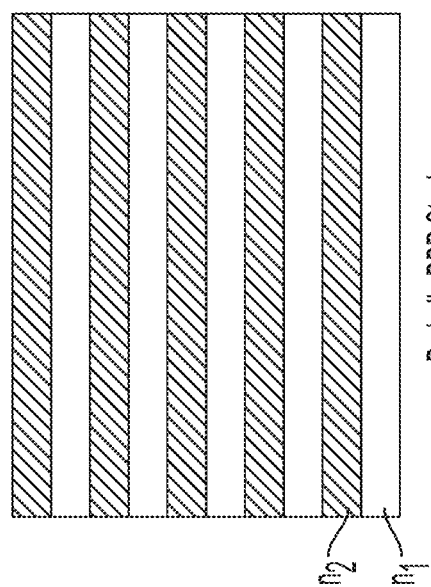
FIG. 1A and FIG. 1B show schematic representation of a periodic DBR stack in FIG. 1A and a random DBR stack in FIG. 1B.

So far, different material systems have been applied in periodic DBRs, including binary and ternary semiconductor DBRs and dielectric DBRs. In binary DBRs, controlling the lattice mismatch between the alternating layers is a challenge, particularly for high N and Δn. On the other hand, strain-compensated ternary DBR structures can reduce the total strain in DBR stacks. However, the growth of strain-compensated ternary DBRs require a much more complicated growth condition and a small growth window. Δn alternative approach is to use nanoporous technology developed earlier in GaN periodic systems, in which lattice-matched GaN semiconductor layers are used. In this approach, air voids are introduced into the GaN material to reduce its refractive index. Then, the same material can be used for both layers which is perfectly lattice matched. The nanoporous GaN system offers a lattice-matched and fast industry-compatible metal-organic chemical vapor deposition (MOCVD) technique, which is advantageous for random DBRs, where a high N and various degrees of randomness are required. The epitaxial nanoporous DBRs can also be easily implemented in III-nitride optoelectronics due to the ease of fabrication process. As used herein, random means that either the GaN or the porous GaN layers do not have a common thickness, but vary within the stack of layers in the DBR. In some examples, the disclosed systems and methods can be applied to other III-materials, such as ternary AlGaN, InGaN, etc, for the DBRs.

Here, lattice-matched nanoporous GaN (NP-GaN) systems are used to demonstrate the random DBRs. Presence of air voids in the NP-GaN causes the effective refractive index of GaN to drop. Therefore, refractive index of NP-GaN can be tuned between ~1 (refractive index of air) to ~2.5 (refractive index of GaN) depending on the porosity. Thus, alternating this layer with GaN to form NP-GaN/GaN lattice matched DBR would be able to introduce enough contrast between the refractive indices. As a result, with fewer number of pairs, one can observe the Anderson localization and thus enhancement of DBR stop-band width in a random DBR compared to periodic DBR. The nanoporous GaN can be simply formed by electrochemical-based porosification of a highly Si-doped GaN layers grown by metal-organic chemical vapor deposition (MOCVD) in an electrolyte solution. Therefore, the NP-GaN/GaN DBR can be formed by selectively-doped GaN using MOCVD followed by electrochemical process.

Broadband DBRs in the visible spectral range using random structures. In addition 1D a totally random structure, an ascending sorted random structure is also considered as one special realization of a random stack. As a proof-of-concept, a calculated 2-3× enhancement is demonstrated in stop-band widths of DBR stacks for random vs. periodic DBRs with $n_1$=1.50 (SiO$_2$) and $n_2$=1.86 (SiN$_x$). A strong dependence of the random DBR reflectance with respect to N is in contrast to the nearly independent reflectance spectral as a function of N after 20 pairs in periodic DBRs. The simulation results were experimentally verified using 25 pairs of dielectric DBRs (SiN$_x$/SiO$_2$ with $\Delta$n~0.36, as confirmed by optical ellipsometry) deposited on a Si substrate. The experimental data also suggests an enhanced stop-band width by a factor of >2.5 (from ~80 nm to ~200 nm) for a sorted random DBR compared to a periodic DBR with the same N and $\Delta$n. In addition, an epitaxial lattice-matched GaN/nanoporous GaN system was considered with higher $\Delta$n~0.57. The epitaxial nanoporous totally random DBRs also showed a wider reflectance stop-band compared to a reference periodic DBR (~200 nm vs. ~80 nm) with 750 nm central wavelength for N=25. The results suggest using the disordered DBR systems as broadband omnidirectional reflectors for optoelectronic and photonic applications.

Figure 1A:
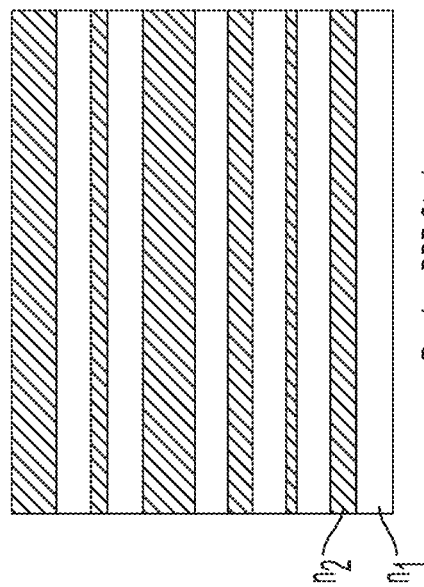

Theoretically, a totally random DBR with large degree of randomness (a=1) can provide an infinitely wide stop-band width with partially reduced reflectivity which can be obtained for infinitely large number of pairs. For practical number of pairs, a finite stop-band width can be obtained for the random DBR which is still considerably larger than that for a periodic DBR with the same total number of pairs (N) and materials. The implementation of such a random system would require large refractive index contrast between the two layers (to allow for smaller number of pairs for practical purposes) and small lattice-mismatches between the layers to avoid strain-induced defects and imperfections. The randomness would then be introduced in the growth plane by varying the thickness of the layers. FIG. 1A and FIG. 1B compare the periodic in FIG. 1A and totally random DBRs in FIG. 1B, described herein, where the thickness of one material is randomized and the thickness of the other material is kept constant. Also considered are structures where the thickness of both materials are randomized throughout the DBR stack.

Figure 2A:
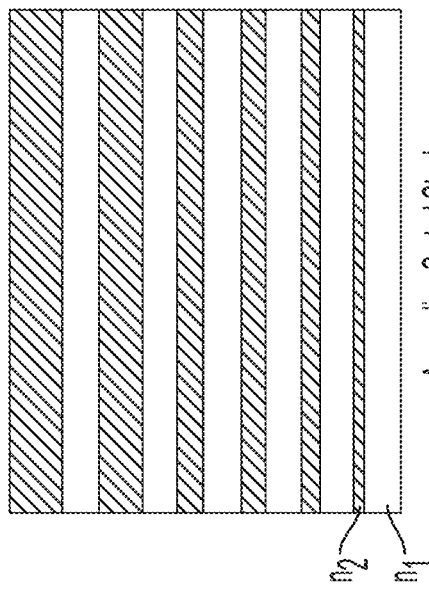
FIG. 2A, FIG. 2B, FIG. 2C, and FIG. 2D show schematic representation of various random stack designs.
Figure 2B:
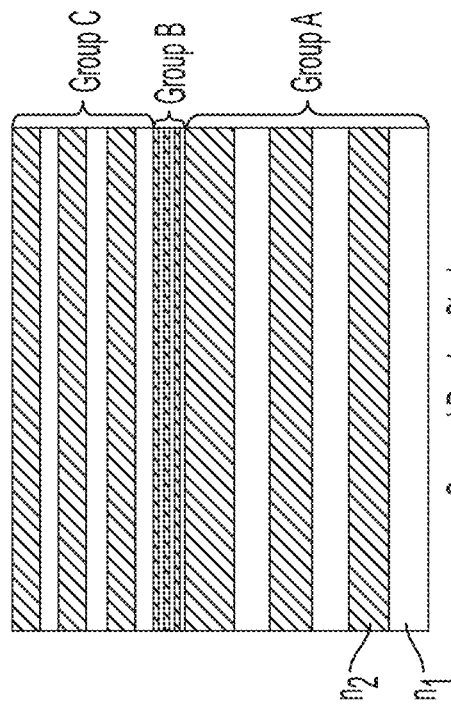
Figure 2C:
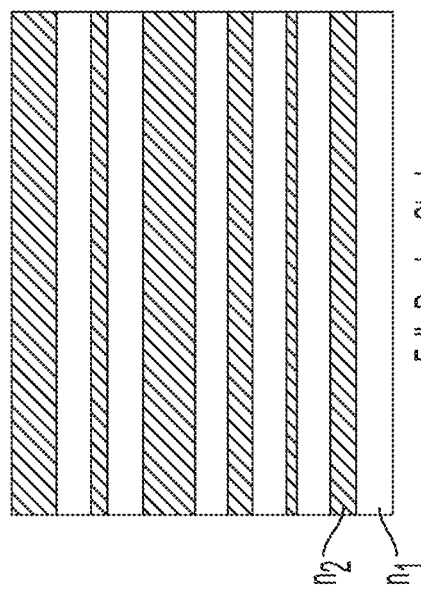
Figure 2D:
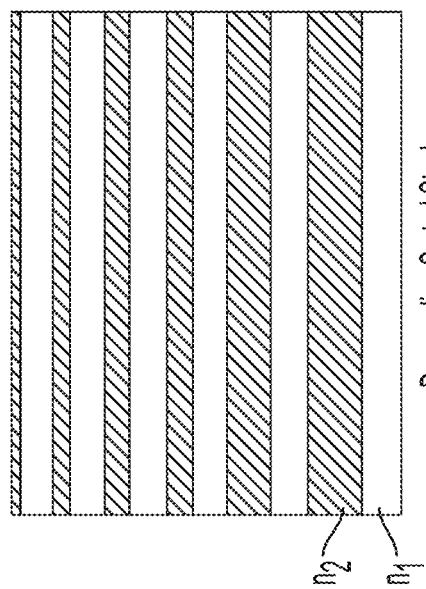

Different stack structures can be considered in the random DBR scheme. Various degrees of randomness can be applied (0<a<1), where a=0 represents periodic and a=1 represents totally random stacks. FIG. 2A, FIG. 2B, FIG. 2C, and FIG. 2D show schematic representation of various random stack designs: FIG. 2A shows a fully random stack, FIG. 2B shows an ascending sorted random, FIG. 2C shows a descending sorted random, and FIG. 2D shows a grouped random stacks. Any of the structures can be designed for different spectral wavelengths. The number of layers, refractive index contrast (material selection), degree of randomness, and central wavelength are the design parameters. In the case of grouped random stack (FIG. 2D), each group is a regular periodic DBR with a specific target central wavelength. The central wavelength and stop-band width of the groups in the grouped random stack can be designed such a way that the stop-bands between the grouped stacks have overlaps and form a spectrally uniform stop-band across a large wavelength range. The number of groups, number of layers in each stacks, the central wavelength position of the groups with respect to one another, and refractive index contrast between the alternating layers can be the engineering parameters. The groups with different thicknesses can be sorted ascending or descending or totally random, and can be implemented by the same or different materials.

Figure 3A:
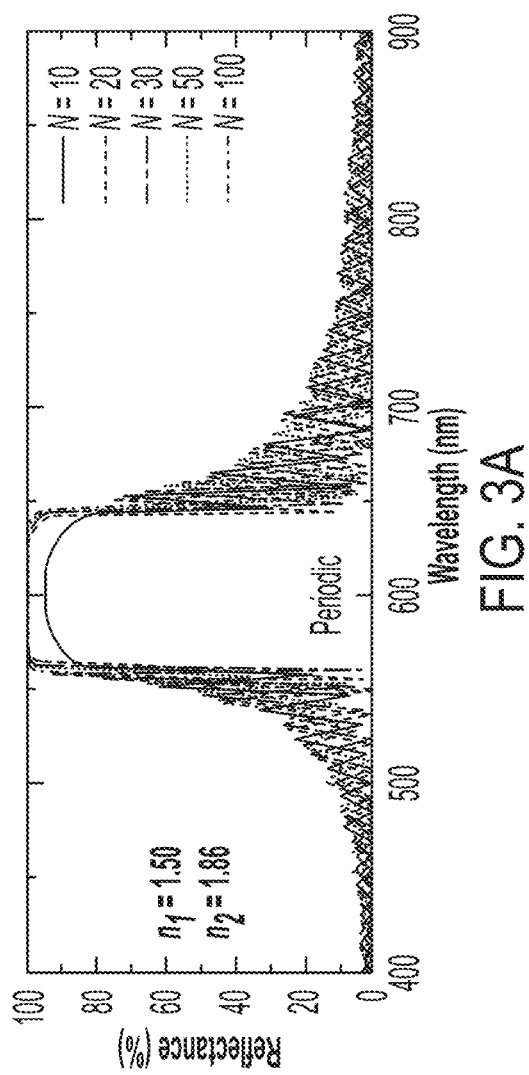
FIG. 3A and FIG. 3B show calculated reflectance spectra for periodic DBRs in FIG. 3A and sorted random DBRs with different number of pairs (from 10 to 100) for $n_1=1.50$ (SiO$_2$) and $n_2=1.86$ (SiN$_x$) in FIG. 3B.
Figure 3B:
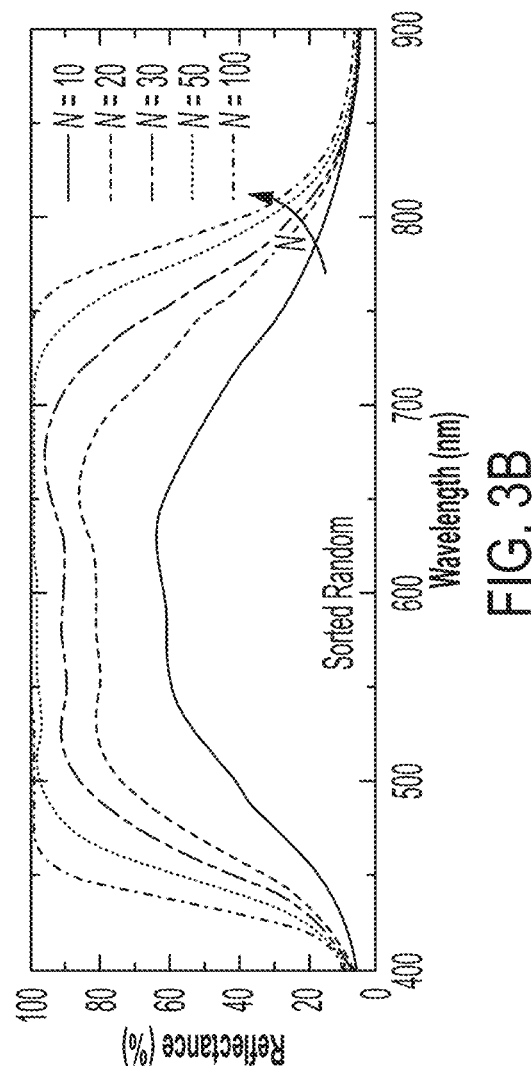

FIG. 3A and FIG. 3B show a comparison of experimental normalized reflectance spectra for a few different designs for dielectric SiO$_2$/SiN$_x$ DBR stacks on Si. A clear enhancement of the reflectance stop-band width for random structures can be observed compared to the periodic structures with the same number of pairs (25 pairs). The fringes in the stop-band spectra of the random structures (which does not appear for the periodic reference structure in FIG. 3A can be improved by using larger number of pairs and/or larger refractive index contrast between the alternating layers.

Figure 4B:
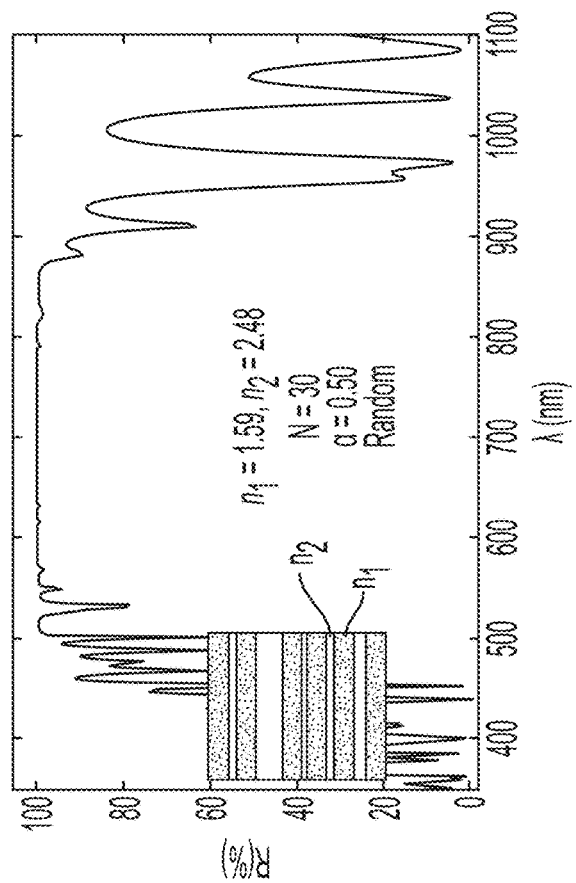
FIG. 4A and FIG. 4B show calculation results of reflectivity spectra for periodic in FIG. 4A and random NP-GaN/GaN DBRs with 30 pairs in FIG. 4B.
Figure 4A:
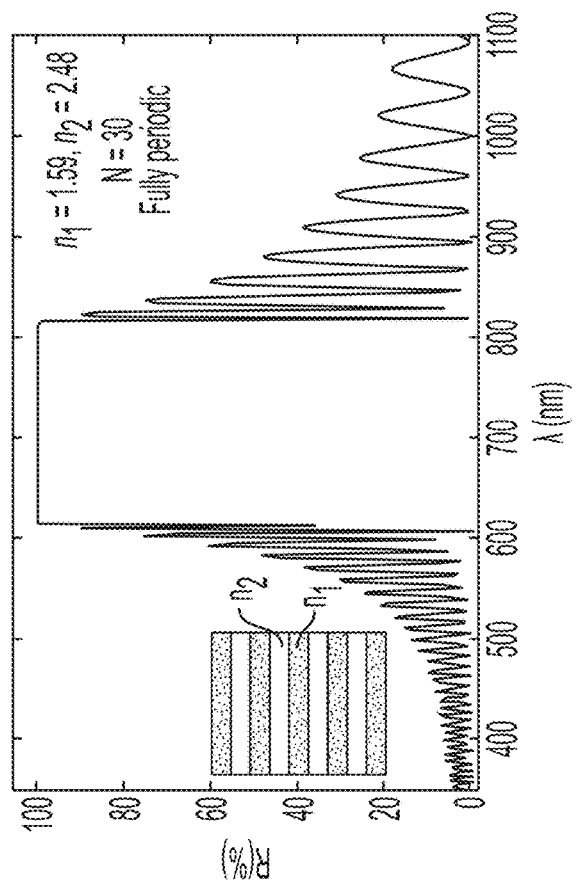

FIG. 4A and FIG. 4B show the calculated confrontationally averaged transmission curves for a totally disordered DBR achieved using a transfer-matrix method. Refractive indices of the two layers ($n_2$=1.50, $n_2$=1.86) are chosen in accordance to the refractive indices of SiO$_2$ and SiN$_x$ as evaluated by optical ellipsometry on calibration samples deposited on Si. The averaging is done over 200 realizations of the disordered DBR with the same parameters. Significantly larger stop-band widths were observed for the random DBR compared to periodic counterpart for the DBRs designed to center at 600 nm. The reflectance of the random DBRs show a strong dependence on N (FIG. 4B), in contrast to the reflectance spectra of the periodic DBRs, which are nearly independent of N after ~20 pairs (FIG. 4A). In random DBRs, for N=30, the stopband covers the entire wavelength range from 500 nm to 700 nm. The reflectance can be further improved by increasing N such that for N=100, the reflectance over 99% for a wide range of wavelengths (450-750 nm) are achieved.

A transfer matrix method is used to calculate and design the random structures and to compare with a periodic DBR. The results of the calculations for N=30 and for $n_{GaN}$~2.48, and $n_{NP\text{-}GaN}$~1.59 for the periodic vs. random DBR is shown in FIGS. 1A and 1B. In this calculation, the degree of randomness is accounted in the layer thickness of the high refractive index material (which is GaN here). A significantly larger stop-band width by factor of ~2 was observed for the random DBR compared to periodic counterpart for the DBRs designed to center at 700 nm.

The numerical simulations in this study follows the approach represented in A. Mafi, "Anderson localization in a partially random Bragg grating and a conserved area theorem," Opt. Lett", OL 40, 3603-3606 (2015). The transmittance of a stack of dielectric layers can be determined using multiplication of each layers transfer matrix. The transmission matrix for a single layer is defined as in B. E. A. Saleh and M. C. Teich, *Fundamentals of Photonics* (Wiley, 2007):

$$M = \begin{bmatrix} M_{11} & M_{12} \\ M_{21} & M_{22} \end{bmatrix}$$

where the matrix elements are:

$$M_{11} = \frac{1}{4n_1 n_2} \left[ (n_1 + n_2)^2 e^{-i\varphi_2} - (n_1 - n_2)^2 e^{i\varphi_2} \right] e^{-i\varphi_1}$$

$$M_{12} = \frac{n_2^2 - n_1^2}{4n_1 n_2} \left[ e^{-i\varphi_2} - e^{i\varphi_2} \right] e^{i\varphi_1}$$

$$M_{21} = M_{12}^*$$

$$M_{22} = M_{11}^*$$

where $n_1$ and $n_2$ are the refractive indices of the materials and $$\varphi_1 = \frac{2\pi}{\lambda_0} n_1 d_1 \text{ and } \varphi_2 = \frac{2\pi}{\lambda_0} n_2 d_2$$

are the accumulated phase in the slab. The transfer matrix of an array of N identical dielectric slabs with varying separations (gaps) of the background dielectric material can be expressed as:

$$M^{(N)} = \prod_{n=1}^{N} M_n$$

where the total transmittance is given by the element (2,2) of $M^{(N)}$ as $T = |M_{22}^{(N)}|^{-2}$. The refractive indexes of the two materials are chosen in accordance to the fabricated samples. The thickness of the higher index material is only randomized and a fixed thickness $$\left( d_1 = \frac{\lambda_0}{4m_1} \right)$$

for the lower index slabs is assumed. The thickness of the higher index material is chosen randomly from $$d_2 \in \frac{\lambda_0}{4n_2} \{-0.5, +0.5\}.$$

This randomization strategy is adopted based on the results reported in A. Mafi, "Anderson localization in a partially random Bragg grating and a conserved area theorem," Opt. Lett", OL 40, 3603-3606 (2015) where 50% disorder is shown to be equivalent to 100% disorder.

FIG. 3A and FIG. 3B show the confrontationally averaged transmission curves for a totally disordered DBR. Refractive indices of the two layers ($n_1$=1.50, $n_2$=1.86} are chosen in accordance to the refractive index of $SiO_2$ and $SiN_x$ as evaluated by optical ellipsometry on calibration samples deposited on Si. The averaging is done over 200 realizations of the disordered DBR with the same parameters. The reflectance of the random DBRs show a strong dependence on N (FIG. 3B), in contrast to the reflectance spectra of the periodic DBRs, which are nearly independent of N after ~20 pairs (FIG. 3A). In random DBRs, for N=30, the stopband covers the entire wavelength range from 500 nm to 700 nm. However, the peak reflectance is lower than 100%, as expected based on the arguments above. Nevertheless, the reflectance can be further improved by increasing N such that for N=100, the reflectance over 99% for a wide range of wavelengths (450-750 nm} are achieved.

Figure 5A:
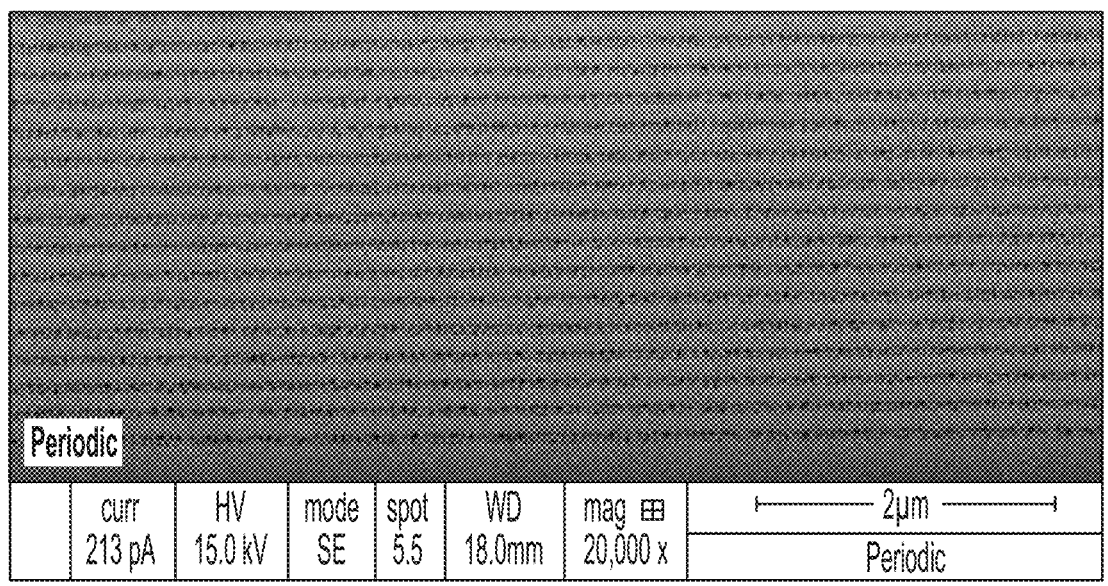
FIG. 5A, FIG. 5B, FIG. 5C, and FIG. 5D show cross-sectional scanning electron microscopy images of (FIG. 5A, FIG. 5B) periodic and (FIG. 5C, FIG. 5D) random nanoporous GaN/GaN DBRs.
Figure 5B:
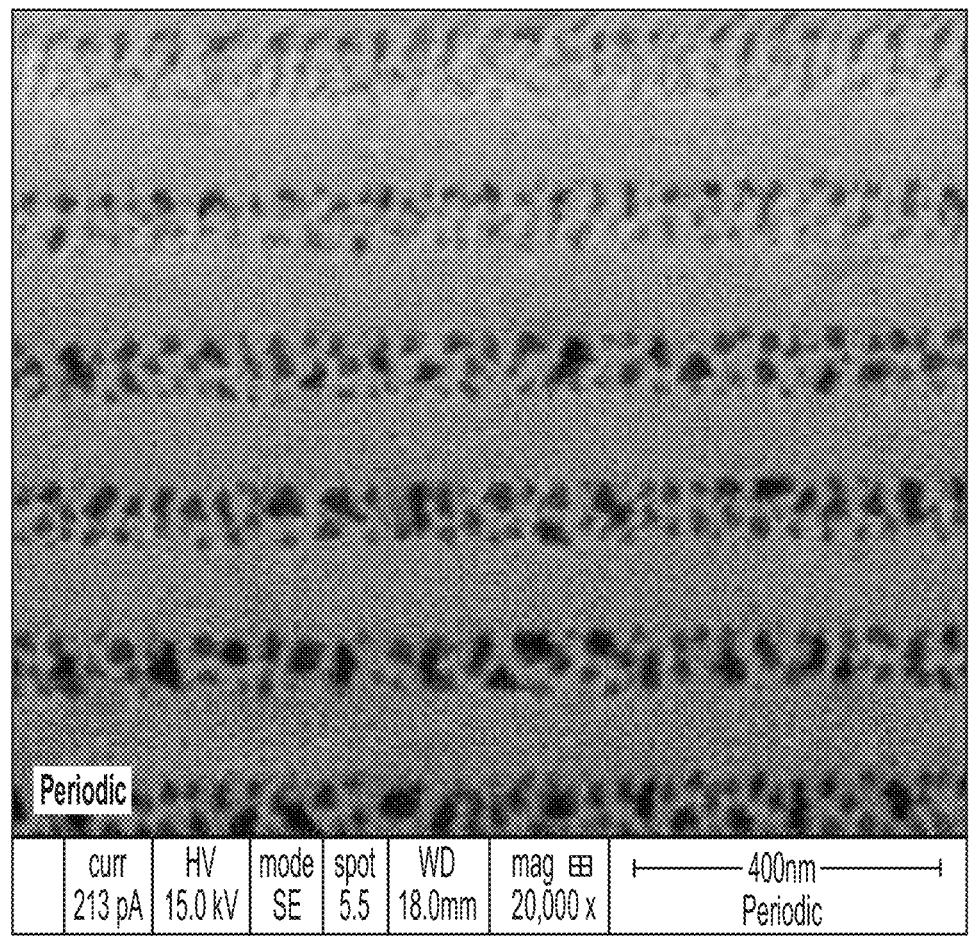
Figure 5C:
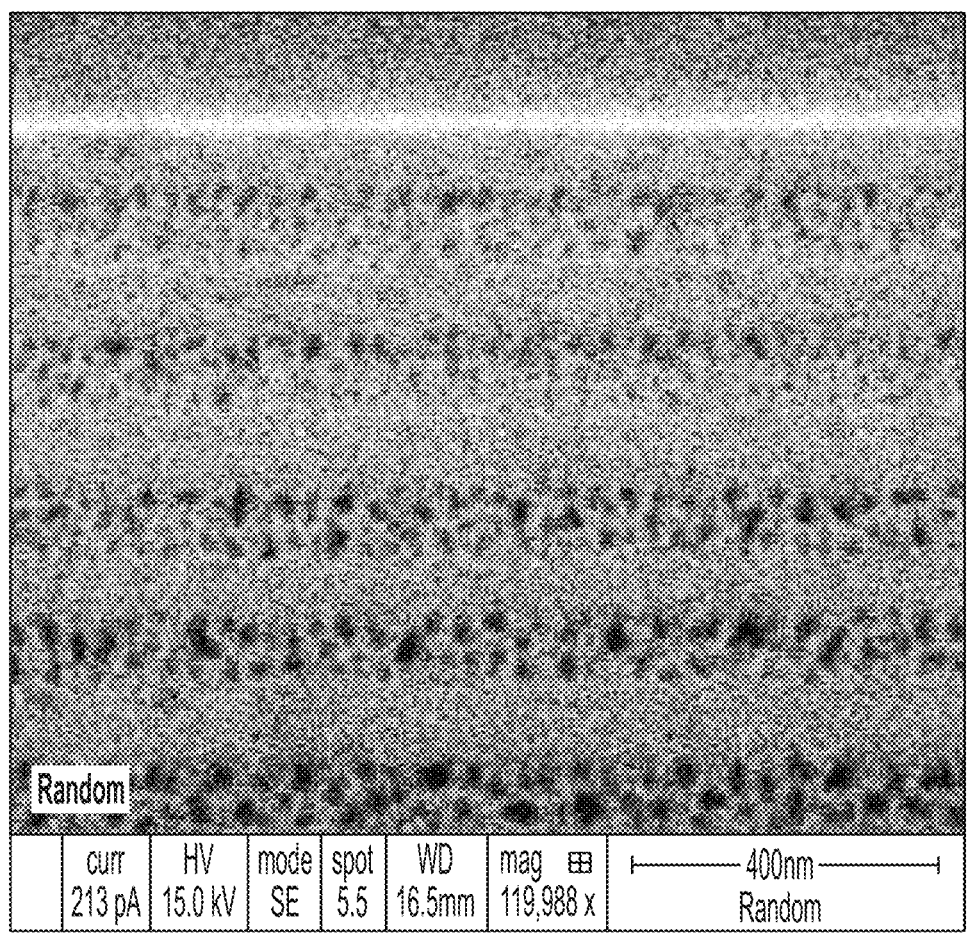
Figure 5D:
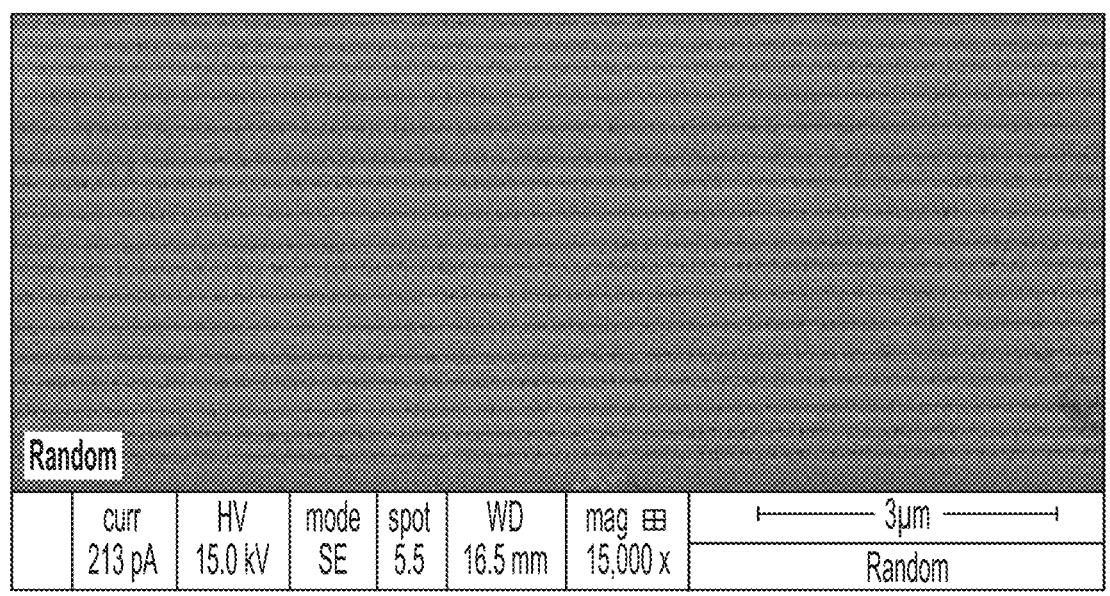
Figure 5E:
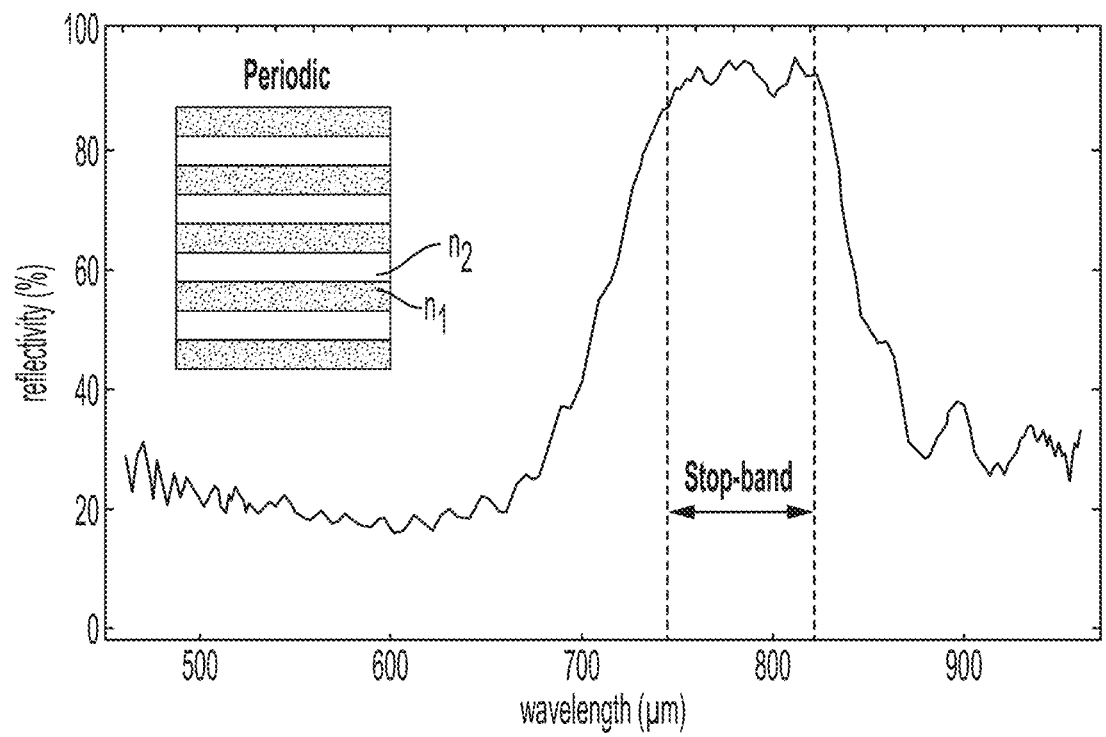
FIG. 5E and FIG. 5F shows measured reflectivity spectra for periodic (FIG. 5E) and random nanoporous GaN/GaN DBRs (FIG. 5F).
Figure 5F:
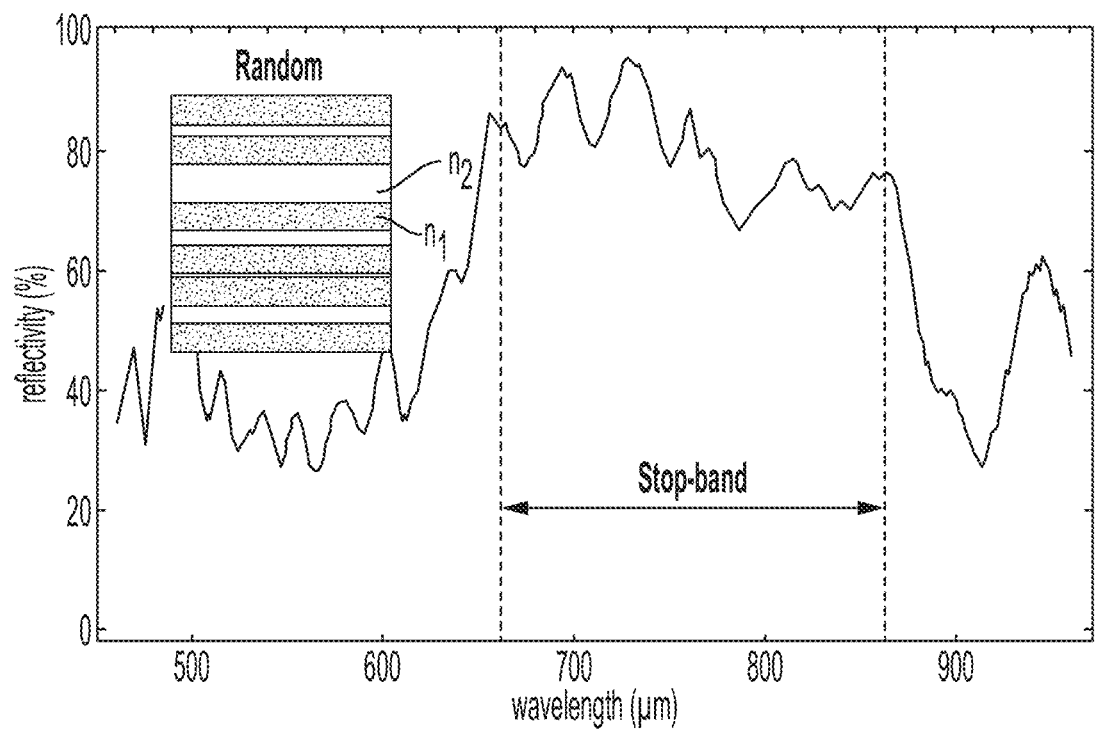
Figure 6A:
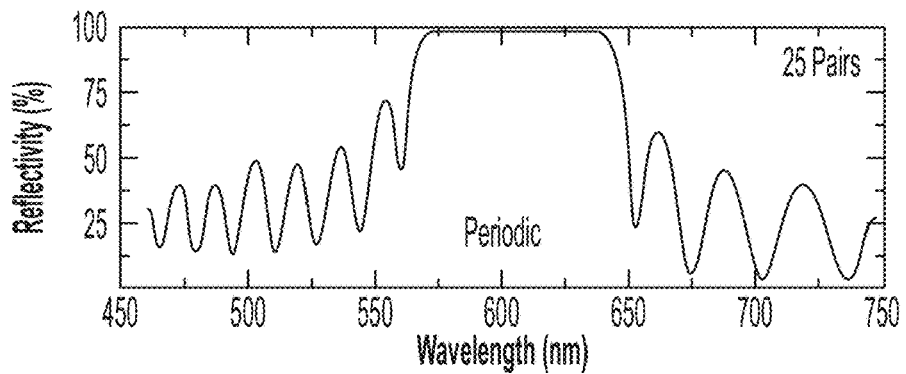
FIG. 6A, FIG. 6B, FIG. 6C, and FIG. 6D shows plots of measured reflectivity spectra for 25 pairs of dielectric (SiO2/SiN$_x$) DBR stacks on Si with different structure designs.
Figure 6B:
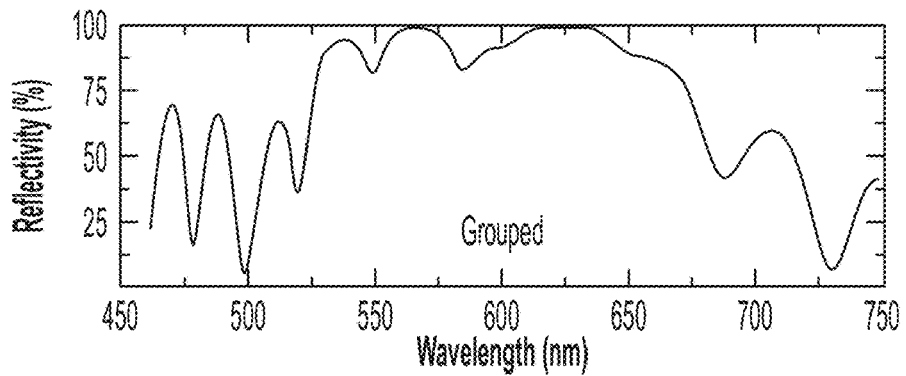
Figure 6C:
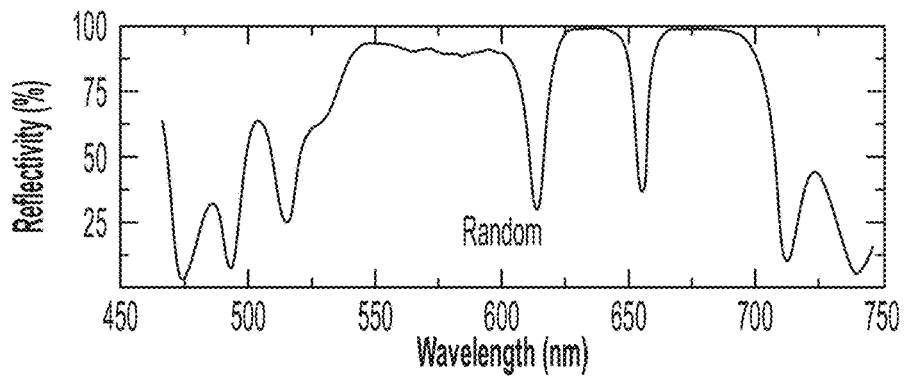
Figure 6D:
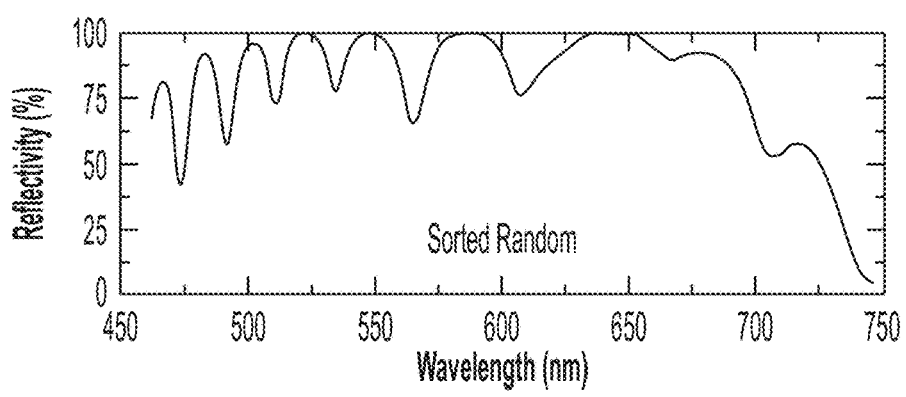

To verify the observed trend in the simulation with experiment a periodic and a totally random DBR with the designed thicknesses from the simulation (to target-~700 nm central wavelength) were grown by MOCVD on GaN on sapphire substrates. The randomness was applied in the thickness of the undoped GaN while keeping the thickness of the doped GaN the same. The two samples were then dry-etched to form the 100 μm×100 μm square shape mesas followed by electrochemical-etching from the sidewalls of the mesas under 9V bias. FIG. 5A, FIG. 5B, FIG. 5C, and FIG. 5D show scanning-electron microscopy (SEM) images, where FIG. 5A and FIG. 5B show SEM images of the final periodic and totally-random (FIG. 5C and FIG. 5D) DBRs are shown in FIGS. 5A-5D. The randomness in the thickness of non-porous GaN layers is visible in FIGS. 5C and 5D. FIG. 5E and FIG. 5F shows spectra for period DBRs (FIG. 5E) and random DBRs (FIG. 5F).

To evaluate the reflectivity of the two structures on the mesas (which is 100 μm×100 μm square shapes), a micro-reflectance (μ-reflectance) setup was used. The presence of Anderson localization of light in the material was verified by the comparison of the reflectivity results of the two DBRs as shown in FIG. 5E and FIG. 5F. The stop-band width of the random DBR (~200 nm) was higher than that of the periodic DBR (~80 nm) by a factor of ~2.5. However, the peak reflectivity values are lower for the random DBR (~80% in average compared to more than 90% for the periodic case). Increasing the number of pairs would further increase the stop-band width according to simulation results (not shown). Also, using planar etch (defect-selective electrochemical etching) provides a platform for easier fabrication process and eliminates the need for precise alignment of DBRs for broad-band waveguide applications.

FIG. 6A, FIG. 6B, FIG. 6C, and FIG. 6D shows a comparison of plots of measured reflectivity spectra for 25 pairs of dielectric (SiO2/SiN) DBR stacks on Si with different structure designs: (FIG. 6A) periodic, (FIG. 6B) grouped random, (FIG. 6C) fully random, and (FIG. 6D) sorted random. A clear enhancement of the reflectance stop-band width for random structures can be observed compared to the periodic structures with the same number of pairs (25 pairs). The fringes in the stop-band spectra of the random structures (which does not appear for the periodic reference structure in FIG. 6A can be improved by using larger number of pairs and/or larger refractive index contrast between the alternating layers.

To implement the DBR structure designs, different material systems can be considered. Dielectric systems, such as $SiN_x$, $SiO_2$, $HfO_2$, $TiO_2$, etc or semiconductor systems such as GaN, AlN, InAlN, AlGaN, and InGaN, are also considered. For dielectric systems, the thicknesses and deposition system (atomic layer deposition, plasma-enhanced chemical vapor deposition, sputtering, etc.) are engineering considerations. For the semiconductor system, layer thicknesses, compositions, number of alternating layers are the engineering parameters. Strain management is also of interest in the semiconductor DBRs which can be controlled via design considerations, strain compensation (by composition in InAlN system), and placement of GaAlInN strain-relieved superlattice to accommodate the strain. To use superlattice to accommodate the strain, the position, number of layers, and, and number of superlattice stacks across the full DBR are the engineering parameters. In the DBR stacks, all the pairs may include of the same material or each pair may be composed of different materials throughout the stack.

Lattice-matched nanoporous GaN (NP-GaN) systems are also considered to be used in random DBRs. Presence of air voids in the NP-GaN causes the effective refractive index of GaN to drop. Therefore, refractive index of NP-GaN can be tuned between ~1 (refractive index of air) to-~2.5 (refractive index of GaN) depending on the porosity. Thus, alternating this layer with GaN to form NP-GaN/GaN lattice matched DBR would be able to introduce enough contrast between the refractive indices. As a result, with fewer number of pairs, one can observe the enhancement of DBR stop-band width in a random DBR compared to periodic DBR. The nanoporous GaN can be simply formed by electrochemical-based porosification of a highly Si-doped GaN layers grown by metal-organic chemical vapor deposition (MOCVD) in an electrolyte solution. Therefore, the NP-GaN/GaN DBR can be formed by selectively-doped GaN using MOCVD followed by electrochemical process. Doping type (Si, Ge), doping concentration, electrochemical solution (nitric acid, sulfuric acid, oxalic acid, etc.) and its molarity, electrochemical etching bias voltage, and etching time are the engineering parameters for the electrochemical etching-induced porosification. FIG. 5 shows the schematic of the porosification of a calibrated periodic GaN/n++GaN multilayer on sapphire. The electrochemical etchings is performed laterally from the mesa sidewalls in FIG. 7. The electrochemical etching can also be performed through defect-selective etching on planar structures via defects on the surface penetrating to the doped layers.

The present disclosure was also experimentally testified in a nanoporous GaN system. A periodic and a totally-random DBR with the designed thicknesses from the simulation (to target ~700 nm central wavelength) were grown by MOCVD on GaN on sapphire substrates. The randomness was applied in the thickness of the unintentionally doped or lightly doped GaN while keeping the thickness of the doped GaN the same. The two samples were then dry-etched to form the 100 μm×100 μm square shape mesas followed by electrochemical-etching from the sidewalls of the mesas under 9V bias. The scanning-electron microscopy (SEM) images of the final periodic (FIG. 5A and FIG. 5B) and totally random (FIG. 5C and FIG. 5D) DBRs are shown in FIGS. 5A-5D. The randomness in the thickness of nonporous GaN layers is visible in FIG. 5C and FIG. 5D. To evaluate the reflectivity of the two structures on the mesas (which is ~100 μm×100 μm square shapes), a micro-reflectance (μ-reflectance) setup was used. The comparison of the reflectivity results of the two DBRs are shown in FIG. 5E and FIG. 5F. The stop-band width of the random DBR (~200 nm) was higher than that of the periodic DBR (~80 nm) by a factor of•~2.5. However, the peak reflectivity values are lower for the random DBR (~80% in average compared to more than 90% for the periodic case). Increasing the number of pairs would further increase the stop-band width according to the simulation results (FIG. 3A and FIG. 3B). Defect selective electrochemical etching on planar structures can be used instead of etching from the mesa sidewalls which may provide a platform for easier fabrication process and eliminates the need for precise alignment of DBRs for applications such as broad-band waveguide applications (FIG. 8A).

Figure 9A:
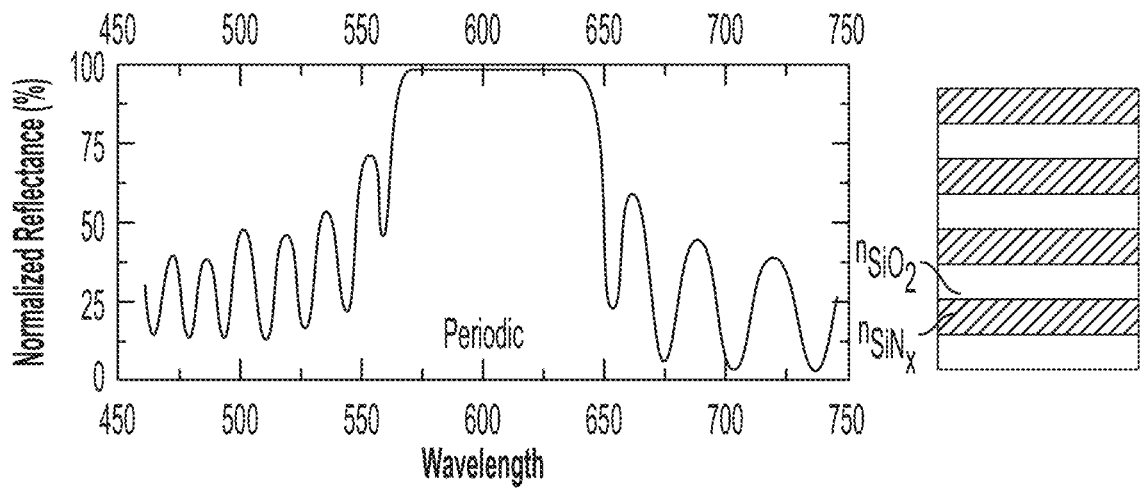
FIG. 9A, FIG. 9B, and FIG. 9C shows measured reflectance spectra for N~25 pairs of (FIG. 9A) periodic, (FIG. 9B) random.
Figure 9B:
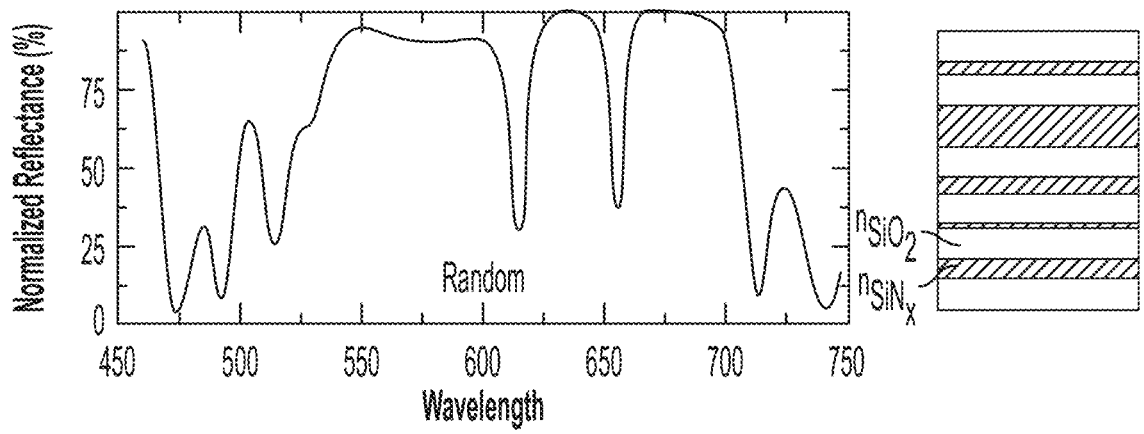
Figure 9C:
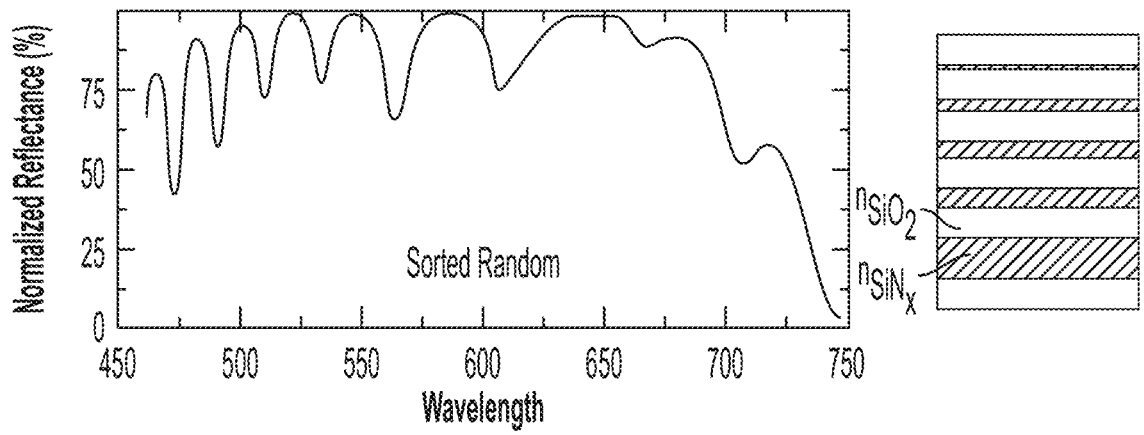

To implement the idea in practice, a dielectric DBR system is considered where $SiO_2$ ($n_1$=1.50) and $SiN_x$ ($n_2$=1.86) with Δn~0.36 were used. The stacks were grown using a plasma-enhanced chemical vapor deposition (PECVD). 25 pairs of dielectric (FIG. 2A) periodic, (FIG. 2B) random, and (FIG. 2C) descending sorted random DBR stacks were deposited on separate Si wafers. To evaluate the reflectance of the samples a reflectance setup was used. FIG. 9A, FIG. 9B, and FIG. 9C compares the reflectivity results of the three DBR stacks. The reference periodic dielectric DBR shows regular stop-band profile with a stop-band width of ~80 nm centered at ~600 nm (FIG. 9A). Unlike the periodic case, the random DBRs do not show flat top stop-bands (FIG. 9B and FIG. 9C). The random DBR demonstrates a significant improvement in stop-band width (~150 nm} (FIG. 9B). The sorted random DBR shows even wider stop-bands (~200 nm) compared to the periodic and random DBRs (FIG. 9C). The appeared fringes in the stop-band region can be eliminated when higher N is applied, based on simulation results (FIG. 3B).

Figure 7:
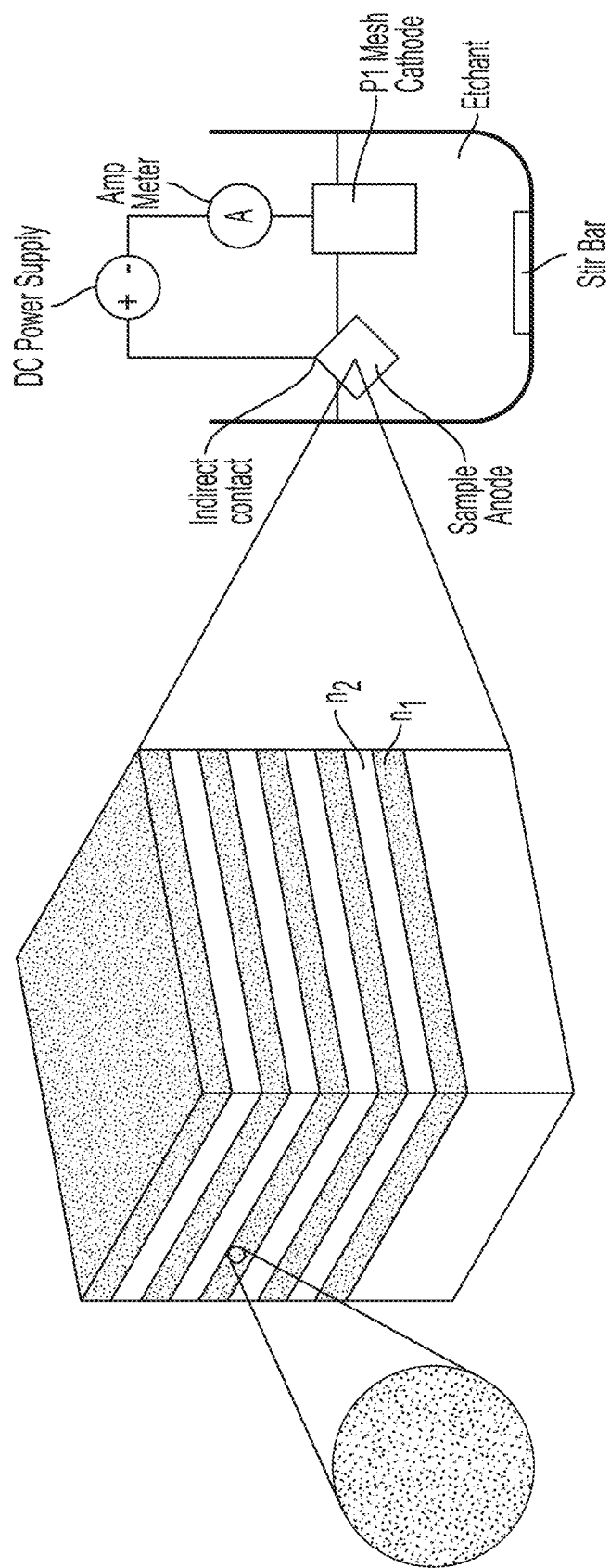
FIG. 7 shows a schematic of the electrochemical etching process on a periodic stack of GaN/n++GaN on sapphire.

As mentioned, epitaxial nanoporous GaN system is advantageous for DBR applications due to the lattice matched, ease of fabrication, fast industry viable growth method, and compatibility with the existing lighting systems. Therefore, an epitaxial nanoporous GaN/GaN system is also considered with higher Δn~0.57 and N=25. Before growing the samples, the refractive index of the nanoporous GaN was evaluated in a calibration sample to design the DBR structures. A periodic structure consists of unintentionally-doped (UID) or lightly doped/heavily Si-doped GaN grown on GaN on sapphire using MOCVD in which trimethylgallium (TMG), Ammonia ($NH_3$), and $SiH_4$ was used as sources of elemental Ga, N, and Si dopant. A high level of Si doping (~2-3×$10^{19}$ $cm^{-3}$) in the heavily doped regions was verified by secondary-ion mass spectroscopy (SIMS). A square mesa structure was then formed on the sample by inductively-coupled plasma (ICP) etching and the sample was etched using an electrochemical (EC) etching setup under 9V bias (FIG. 7). The effective refractive index of the nanoporous layer was then obtained using volume average theory (VAT) in which $n_{por}=[(1-\varphi)n_{GaN}^2+\varphi n_{air}^2]^{1/2}$, where α, $n_{por}$, $n_{GaN}$, and $n_{air}$ are the porosity (the ratio of air-to-GaN), effective refractive index of the nanoporous layer, refractive index of GaN, and refractive index of air, respectively. φ was determined by digitizing the SEM image of the porous layer as shown in FIG. 4C. The VAT calculation reveals $n_{por}$=1.81 assuming $n_{GaN}$=2.38.

A periodic and a sorted random DBR with the designed thicknesses from the simulation (to target ~600 nm central wavelength) were grown by MOCVD on GaN on sapphire substrates. The randomness was applied in the thickness of the GaN (undoped, unintentionally doped, or lightly doped) while keeping the thickness of the doped GaN the same. The two samples were then ICP-etched to form the 100 μm×100 μm square shape mesas followed by EC-etching from the sidewalls of the mesas under 9V bias. A high-resolution scanning electron microscopy (SEM) image of a period DBR sample in cross section after being exposed to the electrochemical etching is shown in FIG. 7. To evaluate the reflectivity of the two structures on the mesas (which is ~100

μm×100 μm square shapes}, a micro-reflectance (μ-reflectance) setup was used. FIG. 5E and FIG. 5F show a comparison of the reflectivity results of the two DBRs. The stop-band width of the random DBR (~200 nm} was higher than that of the periodic DBR (~80 nm) by a factor of ~2.5. However, the peak reflectance values are lower for the random DBR (~80% in average compared to more than 90% for the periodic case). Increasing the number of pairs would further increase the stop-band width according to the simulation results (FIG. 2). Also, using planar etch (defect-selective electrochemical etching) provides a platform for easier fabrication process and eliminates the need for precise alignment of DBRs for broadband waveguide applications (FIG. 8A). The obvious enhancement of stop-band width maintaining a high reflectance is promising for broadband reflectors for various applications within optoelectronics and photonics.

There are several applications that can be considered for the proposed random DBRs. For instance, two of the resulting random DBRs can be placed on top of each other so that a wide-spectra light can propagate through the separation between the DBRs via total-internal reflection (TIR) as shown in FIG. 3A. This will essentially form a broadband air guiding waveguide. Another application is to be used as back-reflectors to enhance light-extraction efficiency (LEE) of LEDs. It is desirable to have omnidirectional back-reflectors for LEDs and solar cells due to non-coherent nature of the sun-light and spontaneous emission of LEDs. The random DBRs are superior to their periodic counterparts for this application due to their lower angular-dependency. In periodic DBRs, when a light wave incidents the DBR with non-zero angle, the effective thicknesses that it sees will be different from the case of a perfectly-normal incidence. This is why a normal periodic DBR has strong angular-dependency, meaning that, the DBR reflectivity spectra significantly alters by changing the incident angle due to change in the effective light path. However, the angular dependence of the reflectivity would be minimal for random DBRs. This is because a slight deviation from a totally random structure would still be random and thus would not drastically alter the reflectivity spectra. Hence, this makes the proposed random DBRs suitable to be applied for omnidirectional back-reflectors required for high LEE LEDs as shown in FIG. 3B. In addition, the proposed method provides a simple, scalable, industrially viable, high quality (due to growth of perfectly lattice matched stacks) and fast (due to fast growth rates of MOCVD compared to other growth techniques) method of fabricating DBRs with wide stop-band m different spectral wavelengths for various applications in photonics and optoelectronics.

Figure 8B:
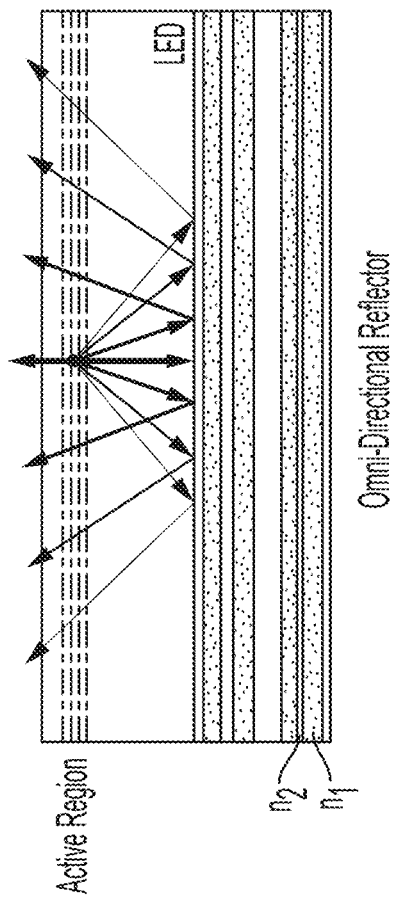
FIG. 8A and FIG. 8B shows schematics of two applications for random broadband DBRs.
Figure 8A:
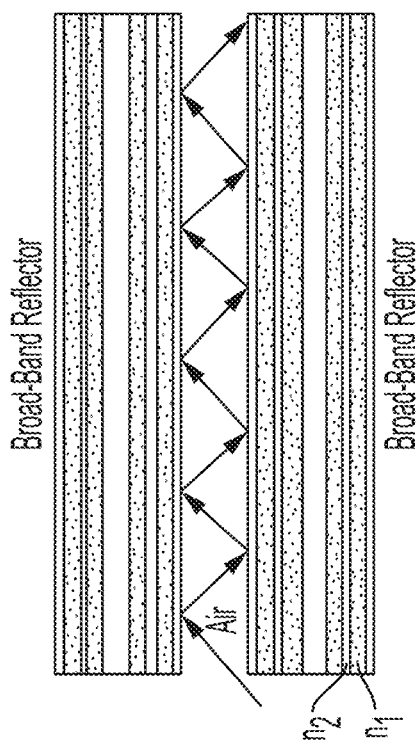

FIG. 8A and FIG. 8B shows schematics of two applications for random broadband DBRs: (FIG. 8A) broad-band air guiding waveguides and (FIG. 8B) high LEE LEDs with a broadband omnidirectional back-reflector. A successful demonstration of a wide-band reflector using a random structure can be used as a broadband waveguide (FIG. 8A). In addition, due to the random nature of the structures, a moderate deviation from the normal incidence still provides a similar reflectance. Hence, random DBRs should offer omnidirectional reflection, which is beneficial for enhancing the light-extraction efficiency (LEE) of light-emitting diodes (LEDs) (FIG. 8B). Due to the incoherent nature of the emitted light in a LED, conventional periodic DBRs are not able to provide a large reflectance for non-perpendicular incidents. Hence, a random DBR structure could enhance the efficiency of the commercial LEDs by increasing LEE.

The advantages of the proposed DBR structure designs include (i) broad stop-band reflectance spectra, (ii) omnidirectional reflection, (iii) enhance light-extraction efficiency (LEE) of LEDs, (iv) perfectly lattice-matched and high-quality DBRs, (v) ease of implementation and fast growth of DBRs by industrially compatible MOCVD growth method. Although the present disclosure is described to be implemented by industrially compatible MOCVD growth technique, other methods such as molecular-beam epitaxy, hydride vapor phase epitaxy, plasma-enhanced chemical vapor deposition, remote-plasma chemical vapor deposition, and sputtering can be employed to growth the DBR stacks. This method can be sued for various wavelengths from ultraviolet to infrared and can be similarly applied to other material systems.

In summary, broadband DBRs in the visible spectral range using random structures have been demonstrated. As a proof-of-concept, a calculated 2-3× enhancement is demonstrated in stop-band widths of DBR stacks for random vs. periodic DBRs with $n_1$=1.50 (SiO$_2$) and $n_2$=1.86 (SiN$_x$). A strong dependence of the random DBH reflectance with respect to N is in contrast to the nearly independent reflectance spectra as a function of N after ~20 pairs in periodic DBRs. The simulation results were experimentally verified using 25 pairs of dielectric DBRs (SiN$_x$/SiO$_2$ with Δn~0.36, as confirmed by optical ellipsometry) deposited on a Si substrate. The experimental data also suggests an enhanced stop-band width by a factor of >2.5 (from ~80 nm to ~200 nm} for a sorted random DBR compared to a periodic DBR with the same N and Δn. In addition, an epitaxial lattice-matched GaN/nanoporous GaN system was considered with higher Δn~0.57. The epitaxial nanoporous totally random DBRs also showed a wider reflectance stop-band compared to a reference periodic DBR (~200 nm vs. ~80 nm) with ~750 nm central wavelength for N=25. The results suggest using the disordered DBR systems as broadband omnidirectional reflectors for optoelectronic and photonic applications.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A random Distributed Bragg Reflector (DBR) comprising:
    a substrate; and
    a plurality of alternating layers of lattice-matched nanoporous GaN (NP-GaN) and GaN with random thickness disposed on a top surface of the substrate forming the random DBR, wherein at least one of the alternating layers has a thickness of $\lambda/4n$ and an adjacent one of the alternating layers does not have a thickness of $\lambda/4n$, wherein $\lambda$ is a wavelength of incident radiation and n is the refractive index of a particular layer of the plurality of alternating layers.

2. The random DBR of claim 1, wherein the NP-GaN is formed by electrochemical-based porosification of a highly Si-doped GaN layers grown by metal-organic chemical vapor deposition (MOCVD), molecular-beam epitaxy (MBE), or atomic layer deposition (ALD) in an electrolyte solution.

3. The random DBR of claim 2, wherein the alternating layers of lattice-matched NP-GaN and GaN are formed by selectively-doped GaN using MOCVD followed by electrochemical process.

4. The random DBR of claim 1, wherein the NP-GaN can be tuned to have a refractive index of around 1 to around 2.5 depending on a porosity of the NP-GaN.

5. The random DBR of claim 1, wherein the random DBR has a reflectivity range for incident radiation of about 200 nm to about 900 nm depending on the index of refraction of the nanoporous GaN, the layer thicknesses, and the number of layer periods.

6. The random DBR of claim 1, wherein the substrate comprises sapphire, Si, SiC, or freestanding GaN.

7. The random DBR of claim 1, wherein a thickness of each NP-GaN layer is the same.

8. The random DBR of claim 1, wherein a thickness of each GaN is not the same.

9. A method of forming a random Distributed Bragg Reflector (DBR) comprising:
    forming a plurality of alternating layers of lattice-matched nanoporous GaN (NP-GaN) and GaN with random thickness disposed on a top surface of the substrate forming the random DBR, wherein at least one of the alternating layers has a thickness of $\lambda/4n$ and an adjacent one of the alternating layers does not have a thickness of $\lambda/4n$, wherein $\lambda$ is a wavelength of incident radiation and n is the refractive index of a particular layer of the plurality of alternating layers.

10. The method claim 9, wherein the NP-GaN is formed by electrochemical-based porosification of a highly Si-doped GaN layers grown by metal-organic chemical vapor deposition (MOCVD), molecular-beam epitaxy (MBE), or atomic layer deposition (ALD) in an electrolyte solution.

11. The method of claim 10, wherein the alternating layers of lattice-matched NP-GaN and GaN are formed by selectively-doped GaN using MOCVD followed by electrochemical process.

12. The method of claim 9, wherein the NP-GaN can be tuned to have a refractive index of around 1 to around 2.5 depending on a porosity of the NP-GaN.

13. The method of claim 9, wherein the random DBR has a reflectivity range for incident radiation of about 200 nm to about 900 nm depending on the index of refraction of the nanoporous GaN, the layer thicknesses, and the number of layer periods.

14. The method of claim 9, wherein the substrate comprises sapphire, Si, SiC, or freestanding GaN.

15. The method of claim 9, wherein a thickness of each NP-GaN layer is the same.

16. The method of claim 9, wherein a thickness of each GaN is not the same.

17. The method of claim 9, wherein layers of GaN are arranged in descending order or ascending order based on thickness or grouped with other layers of a common thickness.

18. The method of claim 9, wherein the nanoporous GaN comprises a ternary arrangement comprising AlGaN or InGaN.

19. A waveguide comprising:
    a first random Distributed Bragg Reflector (DBR) comprising: a first substrate; and a first set of a plurality of alternating layers of lattice-matched nanoporous GaN (NP-GaN) and GaN formed on a top surface of the substrate, wherein at least one of the first set of alternating layers has a thickness of $\lambda/4n$ and an adjacent one of the first set of alternating layers does not have a thickness of $\lambda/4n$, wherein $\lambda$ is a wavelength of incident radiation and n is the refractive index of a particular layer of the plurality of alternating layers;
    a second random Distributed Bragg Reflector (DBR) comprising: a second substrate; and a second set of a plurality of alternating layers of lattice-matched nanoporous GaN (NP-GaN) and GaN formed on a top surface of the first random DBR, wherein at least one of the second set of alternating layers has a thickness of $\lambda/4n$ and an adjacent one of the second set of alternating layers does not have a thickness of $\lambda/4n$,
    wherein spectra light propagating through a separation of the first DBR and the second DBR via total internal reflection.

20. A light emitting diode (LED) device comprising:
a LED; and
a back reflector configured to reflect light from the LED, wherein the back reflector comprises a random Distributed Bragg Reflector (DBR) comprising: a substrate; and a plurality of alternating layers of lattice-matched nanoporous GaN (NP-GaN) and GaN with random thickness formed on a top surface of the substrate, wherein at least one of the alternating layers has a thickness of $\lambda/4n$ and an adjacent one of the alternating layers does not have a thickness of $\lambda/4n$, wherein $\lambda$ is a wavelength of incident radiation and n is the refractive index of a particular layer of the plurality of alternating layers.

* * * * *